United States Patent
De Groot et al.

(10) Patent No.: US 10,228,626 B2
(45) Date of Patent: Mar. 12, 2019

(54) MOVABLE SUPPORT AND LITHOGRAPHIC APPARATUS

(71) Applicant: ASML Netherlands B.V., Veldhoven (NL)

(72) Inventors: Antonius Franciscus Johannes De Groot, Someren (NL); Theo Anjes Maria Ruijl, Eindhoven (NL); Christiaan Louis Valentin, Eindhoven (NL); Christian Werner, Beek en Donk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/736,297

(22) PCT Filed: Apr. 28, 2016

(86) PCT No.: PCT/EP2016/059508
§ 371 (c)(1),
(2) Date: Dec. 13, 2017

(87) PCT Pub. No.: WO2017/005387
PCT Pub. Date: Jan. 12, 2017

(65) Prior Publication Data
US 2018/0356738 A1 Dec. 13, 2018

(30) Foreign Application Priority Data
Jul. 9, 2015 (EP) .................................... 15176135

(51) Int. Cl.
G03F 7/20 (2006.01)
G03B 27/58 (2006.01)
(Continued)

(52) U.S. Cl.
CPC ......... *G03F 7/70758* (2013.01); *G03B 27/58* (2013.01); *G03F 7/70725* (2013.01);
(Continued)

(58) Field of Classification Search
CPC ............. G03F 7/70775; G03F 7/70725; G03F 7/70758; G03F 7/70716
(Continued)

(56) References Cited

U.S. PATENT DOCUMENTS

| 5,661,388 A | 8/1997 | Kurosawa |
| 7,095,485 B2 | 8/2006 | Hol et al. |

(Continued)

FOREIGN PATENT DOCUMENTS

| CN | 104110561 | 10/2014 |
| JP | H07321024 | 12/1995 |

(Continued)

OTHER PUBLICATIONS

International Search Report and Written Opinion dated Aug. 8, 2016 in corresponding International Patent Application No. PCT/EP2016/059508.

(Continued)

*Primary Examiner* — Hung Nguyen
(74) *Attorney, Agent, or Firm* — Pillsbury Winthrop Shaw Pittman LLP

(57) ABSTRACT

A movable support configured to support an object, the support including: a support plane to support the object, an actuator assembly to move the movable support in a first direction and in a second direction perpendicular to the first direction, wherein the first direction and the second direction extend in a plane parallel to the support plane, wherein the actuator assembly includes: a first actuator configured to exert a first actuation force in a first actuation direction, the first actuation direction being parallel to the support plane, (Continued)

a second actuator configured to exert a second actuation force in a second actuation direction, the second actuation direction being parallel to the support plane, wherein the first actuation direction and the second actuation direction are arranged non-parallel and non-perpendicular with respect to each other.

20 Claims, 3 Drawing Sheets

(51) Int. Cl.
    *H01L 21/027*     (2006.01)
    *H01L 21/68*     (2006.01)

(52) U.S. Cl.
    CPC ........ *G03F 7/70775* (2013.01); *H01L 21/027* (2013.01); *H01L 21/68* (2013.01)

(58) Field of Classification Search
    USPC ...................................... 355/72–76
    See application file for complete search history.

(56) References Cited

U.S. PATENT DOCUMENTS

| | | | | |
|---|---|---|---|---|
| 8,140,288 | B2* | 3/2012 | Yang | .................. G03F 7/70758 318/128 |
| 9,389,518 | B2 | 7/2016 | De Groot et al. | |
| 2005/0146169 | A1 | 7/2005 | Thallner | |
| 2007/0041024 | A1 | 2/2007 | Gao et al. | |
| 2008/0166213 | A1 | 7/2008 | Hunter | |
| 2008/0285004 | A1 | 11/2008 | Binnard et al. | |
| 2012/0057140 | A1* | 3/2012 | Aoki | .................. G03F 7/70716 355/53 |
| 2012/0092638 | A1 | 4/2012 | Park et al. | |
| 2013/0033122 | A1 | 2/2013 | Binnard | |
| 2013/0162968 | A1 | 6/2013 | De Groot et al. | |

FOREIGN PATENT DOCUMENTS

| | | |
|---|---|---|
| JP | 11-243676 | 9/1999 |
| JP | 2005303196 | 10/2005 |
| JP | 2010-074976 | 4/2010 |
| JP | 2013135216 | 7/2013 |
| JP | 2015536125 | 12/2015 |
| WO | 2014/044496 | 3/2014 |
| WO | 2014/136143 | 9/2014 |

OTHER PUBLICATIONS

International Preliminary Report on Patentability dated Jan. 9, 2018 in corresponding International Patent Application No. PCT/EP2016/059508.

Japanese Office Action issued in corresponding Japanese Patent Application No. 2017-564578, dated Nov. 21, 2018.

\* cited by examiner

MOVABLE SUPPORT AND LITHOGRAPHIC APPARATUS

CROSS REFERENCE TO RELATED APPLICATION

This application is the U.S. national phase entry of PCT patent application no. PCT/EP2016/059508, which was filed on Apr. 28, 2016, which claims the benefit of priority of European patent application no. 15176135.0, which was filed on Jul. 9, 2015, and which is incorporated herein in its entirety by reference.

BACKGROUND

Field of the Invention

The present invention relates to a movable support and a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, on1e, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a known embodiment of a lithographic apparatus, the patterning device is supported by a movable support to provide a scanning movement of the patterning device. The scanning movement is carried out in a single scanning direction. This scanning movement requires relative large acceleration forces in this scanning direction, i.e. a direction parallel to the main plane of the patterning device. Furthermore, smaller forces are required in a second direction perpendicular to the scanning direction and parallel to the main plane to control the position of the patterning device in this second direction.

In a known embodiment of a patterning device support, an actuator assembly with Lorentz actuators is provided to move the patterning device support in the scanning direction and the second direction. This known actuator assembly comprises actuators configured to exert an actuation force in the scanning direction to accelerate the patterning device support in the scanning direction and actuators configured to exert an actuation force in the second direction for any desired movements of the patterning device support in this second direction.

Generally, there is a continuous desire to improve throughput of a lithographic apparatus. To increase throughput, it is desirable to increase the acceleration and deceleration of the patterning device support. In order to increase the acceleration of the patterning device support, the actuation forces provided by the actuator assembly should be increased. However, an increase of the actuation forces normally also means an increase in the mass of the actuators.

A drawback of the known actuator assembly of Lorentz actuators is that there is a maximum ratio of actuation force per mass that can be provided by the Lorentz actuators which limits the maximum acceleration that can be obtained by the actuator assembly. In practice, this may have the effect that the desired accelerations for the patterning device support can no longer be reached when using an actuator assembly with Lorentz actuators.

Generally, it is also desirable to increase acceleration of other movable supports of the lithographic apparatus, such as the substrate support.

SUMMARY

It is desirable to provide a movable support comprising an actuator assembly which enables to increase throughput of the lithographic process, and allows high acceleration and deceleration of the movable support. More generally, it is desirable to provide an actuator assembly which enables an efficient use of actuator forces.

Furthermore, it is desirable to provide a lithographic apparatus comprising a movable support, in particular a patterning device support or a substrate support, having such actuator assembly.

According to an aspect of the invention, there is provided a movable support configured to support an object, comprising:
a support plane to support the object,
an actuator assembly to move the movable support in a first direction and in a second direction perpendicular to the first direction, wherein the first direction and the second direction extend in a plane parallel to the support plane,
wherein the actuator assembly comprises:
a first actuator configured to exert a first actuation force in a first actuation direction, said first actuation direction being parallel to the support plane,
a second actuator configured to exert a second actuation force in a second actuation direction, said second actuation direction being parallel to the support plane,
wherein the first actuation direction and the second actuation direction are arranged non-parallel and non-perpendicular with respect to each other.

According to an aspect of the invention, there is provided a lithographic apparatus comprising a movable support configured to support an object, the movable support comprising: a support plane to support the object,
an actuator assembly to move the movable support in a first direction and in a second direction perpendicular to the first direction, wherein the first direction and the second direction extend in a plane parallel to the support plane,
wherein the actuator assembly comprises:
a first actuator configured to exert a first actuation force in a first actuation direction, said first actuation direction being parallel to the support plane,
a second actuator configured to exert a second actuation force in a second actuation direction, said second actuation direction being parallel to the support plane, wherein the first actuation direction and the second actuation direction are arranged non-parallel and non-perpendicular with respect to each other, wherein the movable support is a patterning device support or a substrate support.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
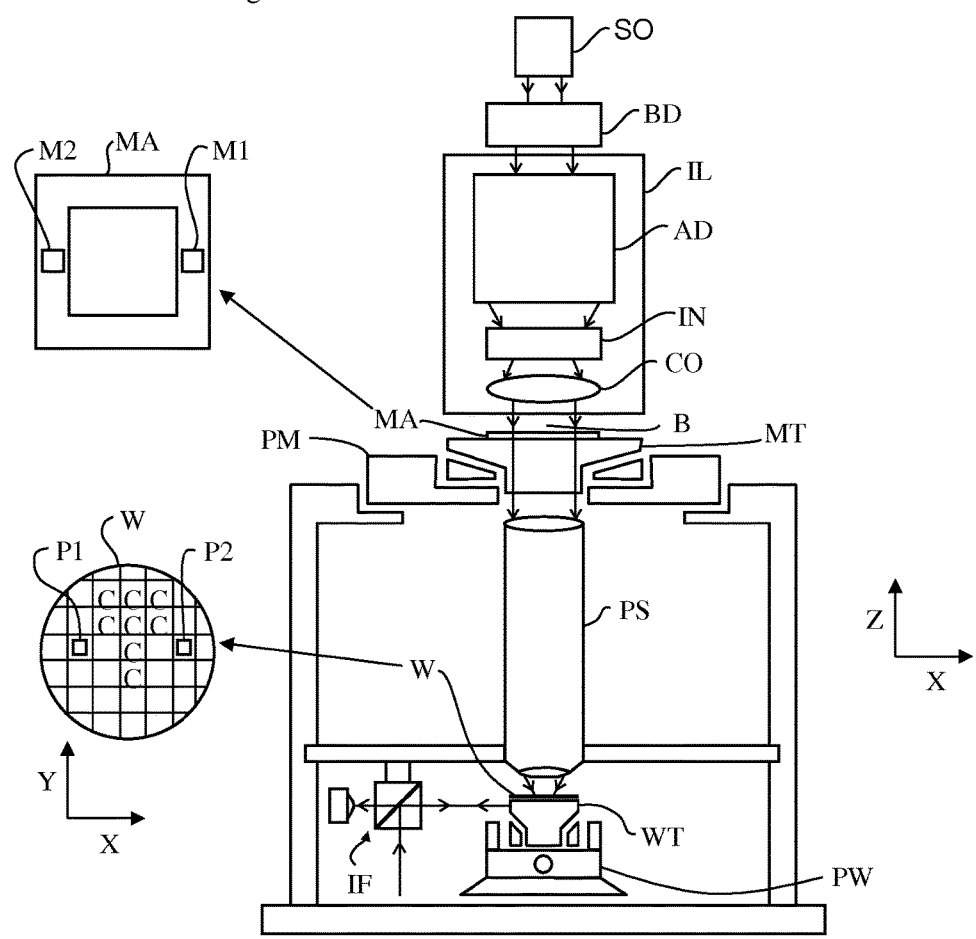
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Figure 2:
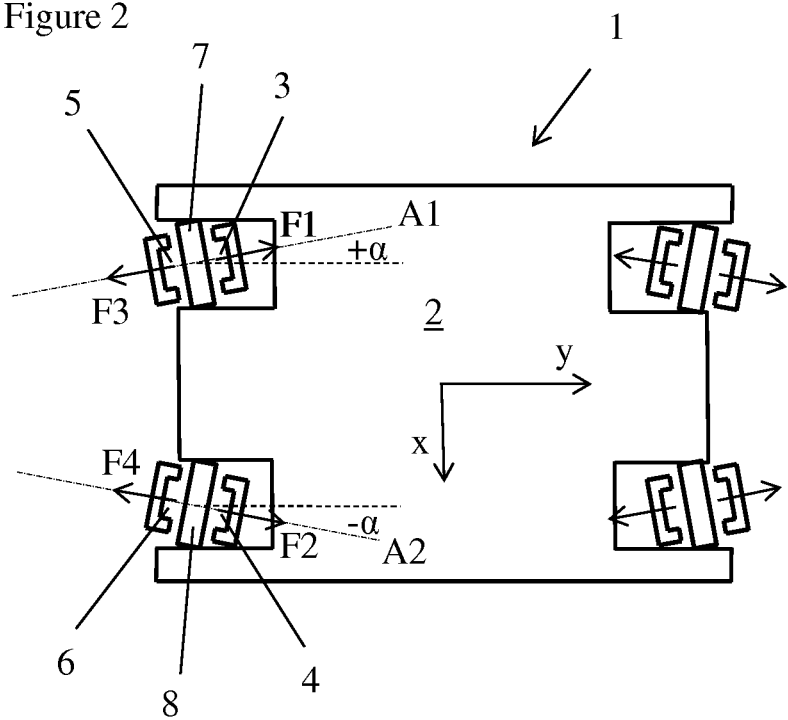
FIG. 2 depicts a top view of a first embodiment of a patterning device support.

FIG. 2 shows a top view of a patterning device support 1. The patterning device support 1 comprises a main body and an actuator assembly. The main body comprises a support plane 2 configured to support a patterning device MA. The support plane 2 defines the orientation of the patterning device MA supported by the support plane 2. The support plane may be a flat surface, but also be defined by a number of support points, such as burls. In FIG. 2, the support plane 2 extends parallel to the plane of the drawing.

The patterning device support 1 is configured to make a scanning movement during the transfer of a pattern from the patterning device MA to a substrate supported by the substrate support. During the transfer of this pattern, it is desirable that the patterning device support 1 is moved at a substantially constant speed. Between the transfer of the pattern onto two subsequent target portions of the substrate, the patterning device support 1 should be decelerated and accelerated in the reverse direction up to the desired scanning speed.

In order to have an efficient transfer process to multiple target portions on a substrate, it is desirable that the time needed for deceleration and acceleration is minimized. This requires the use of a suitable actuator assembly that is capable of decelerating and accelerating the patterning device support at a high rate.

Further, the actuator assembly should be capable of moving the patterning device support 1 in a direction perpendicular to the scanning direction, in order to correct the position of the patterning device MA with the projection system PS and/or substrate support WT. However, the required forces in the scanning direction are substantially higher than the forces needed in the direction perpendicular to the scanning direction. Therefore, the scanning direction can be indicated as dominant direction and the direction perpendicular to the scanning direction can be indicated as non-dominant direction.

It is remarked that both the scanning direction and the direction perpendicular to the scanning direction are substantially parallel to the support plane 2 of the patterning device support 1. In this application the scanning direction is denoted as y-direction and the direction perpendicular to the scanning direction is denoted as x-direction.

The actuator assembly of the patterning device support 1 shown in FIG. 2 comprises at each side of the main body a first actuator 3, a second actuator 4, a third actuator 5 and a fourth actuator 6. The first actuator 3, the second actuator 4, the third actuator 5 and the fourth actuator 6 are reluctance type actuators, comprising a coil and a core of magnetizable material. Actuators of the reluctance type can only exert an actuation force in a single positive or negative direction, i.e. push or pull. In the shown embodiments, the cores are mounted on the patterning device support, and may also be referred to as mover elements, while the coils are mounted on a support or reference device.

The first actuator 3 and the third actuator 5 have a first common core 7 and the second actuator 4 and the fourth actuator 6 have a second common core 8.

The first actuator 3 is configured to exert, upon actuation, a first actuation force F1 on the first common core 7 in a positive direction of a first actuation direction A1. The third actuator 5 is configured to exert a third actuation force F3 on the first common core 7 in the negative direction of the first actuation direction A1.

The second actuator 4 is configured to exert a second actuation force F2 on the second common core 8 in a positive direction of a second actuation direction A2. The fourth actuator 6 is configured to exert a fourth actuation force F4 in the negative direction of the second actuation direction A2.

It is remarked that positive direction and negative direction of a direction in this application means parallel to each other, but in opposite directions.

The advantage of the actuator assembly of the embodiment of FIG. 2 is that the first actuation direction A1 and the second actuation direction A2 are non-parallel and non-perpendicular. In particular, the first actuation direction A1 and the second direction A2 are arranged with respect to the scanning direction y at an angle of +α and −α, respectively, wherein α is between 0 and 45 degrees. This has the advantage that the main part of the actuation forces F1, F2, F3 and F4 will have effect in the dominant y-direction, while the smaller part of the actuation forces F1, F2, F3 and F4 will have effect in the non-dominant x-direction.

In the shown application of the patterning device support 1, the required forces in the dominant y-direction are substantially larger than the required forces in the non-dominant x-direction, for example in a ratio 30:1. Therefore, it is desirable to have a small angle α so that a main part of the actuation forces F1, F2, F3 and F4 of the actuators 3, 4, 5, 6 will be effected in the dominant direction. The angle α may be in the range 0 to 10, for example 2 or 3 degrees.

The arrangement of the four actuators 3, 4, 5, 6 provides a very efficient use of the actuation forces F1, F2, F3 and F4 of the actuators 3, 4, 5, 6.

To move the patterning device support 1 in the positive y-direction, the first actuator 3 and the second actuator 4 can be simultaneously actuated, whereby the parts of the first actuation force F1 and the second actuation force F2 in the x-direction will be compensated by each other, while the parts of the first actuation force F1 and the second actuation force F2 in the y-direction will add up.

Since the angle α is small, this will result in a large part of the first actuation force F1 and the second actuation force F2 being available for the deceleration and acceleration of the patterning device support 1 in the y-direction, i.e. the scanning direction.

Correspondingly, the patterning device support 1 can be moved in the negative y-direction by simultaneous actuation of the third actuator 5 and the fourth actuator 6, whereby the parts of the third actuation force F3 and the fourth actuation force F4 in the x-direction will be compensated by each other, while the parts of the third actuation force F3 and the fourth actuation force F4 in the y-direction will add up.

To move the patterning device support 1 in the positive x-direction, the second actuator 4 and the third actuator 5 can be simultaneously actuated, whereby the parts of the second actuation force F2 and the third actuation force F3 in the y-direction will be compensated by each other, while the parts of the second actuation force F2 and the third actuation force F3 in the x-direction will add up. Since the parts of the actuation forces in the y-direction being compensated by each other are relatively large, the resulting force in the x-direction is relatively small, but sufficient for the movements to be carried out in this x-direction.

Correspondingly, the patterning device support 1 can be moved in the negative x-direction by simultaneous actuation of the first actuator 3 and the fourth actuator 6, whereby the parts of the first actuation force F1 and the fourth actuation force F4 in the y-direction will be compensated by each other, while the parts of the first actuation force F1 and the fourth actuation force F4 in the x-direction will add up.

It will be clear that when designing the patterning device support 1 the angle α can be selected in dependence on the ratio between the desired forces in the x-direction and the y-direction, in order to obtain an efficient distribution of the actuation forces of the actuators over the x-direction and y-direction.

Hereinabove, the actuator assembly of the patterning device support 1 at one side of the main body has been described. At the other side (right side in FIG. 2) of the main body a similar set of four actuators has been provided. These actuators also comprise a first actuator configured to exert a first actuation force in a positive direction of the first actuation direction A1, a second actuator configured to exert a second actuation force in a positive direction of the second actuation direction A2, a third actuator configured to exert a third actuation force in the negative direction of the first actuation direction A1, and a fourth actuator configured to exert a fourth actuation force in the negative direction of the second actuation direction A2.

It is advantageous to provide a set of four actuators at each side of the main body to reduce the forces and the resulting deformations that have to be absorbed by the main body of the patterning device support 1.

Figure 3:
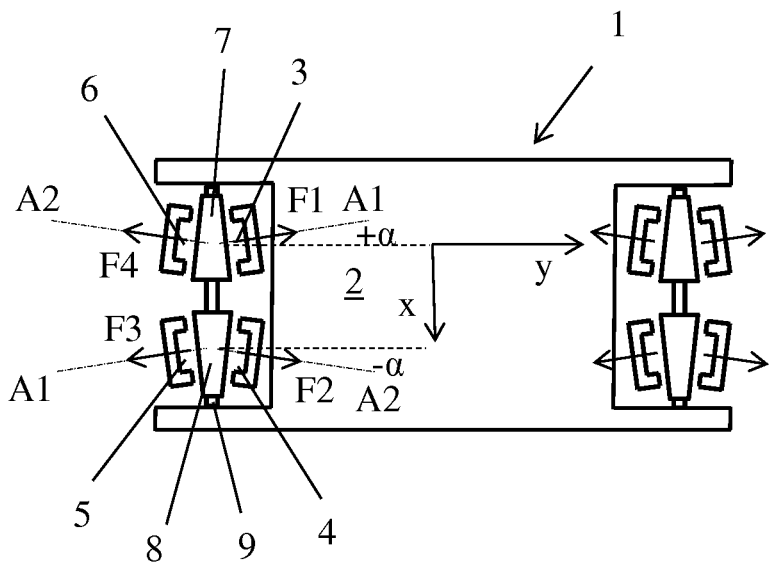
FIG. 3 depicts a top view of a second embodiment of a patterning device support.

FIG. 3 shows an alternative embodiment of the patterning device support 1. The patterning device support 1 comprises at each side of the main body a set of four actuators. The four actuators comprise a first actuator 3 and a third actuator 5 to exert a first actuation force F1 and a third actuation force F3 in the positive direction and negative direction of the first actuation direction A1, respectively, and a second actuator 4 and a fourth actuator 6 to exert a second actuation force F2 and a fourth actuation force F4 in the positive direction and negative direction of the second actuation direction A2, respectively.

A relevant difference with respect to the embodiment of FIG. 2 is the shape of the common cores 7, 8.

In the embodiment of FIG. 2, the outer surfaces of the common cores 7, 8 facing the respective actuators 3, 5 and 4, 6 are parallel so that the actuators sharing a common core 7, 8 are capable of exerting an actuation force in the positive and negative direction of the same actuation direction. In the embodiment of FIG. 3 the first common core 7 is wedge shaped, i.e. a first outer surface of the first common core 7 facing the coil of the first actuator 3 is arranged at an angle between 0 and 90 degrees with respect to a second outer surface of the first common core 7 facing the coil of the fourth actuator 6. Correspondingly, the second common core 8 is wedge shaped, i.e. a first outer surface of the second common core 8 facing the coil of the second actuator 4 is arranged at an angle between 0 and 90 degrees with respect to a second outer surface of the second common core 8 facing the coil of the third actuator 5.

The angle between the first outer surface and the second outer surface the wedge shaped first common core 7 and wedge shaped second common core 8, as shown in FIG. 3, the same. As a result, each common core 7, 8 can be used to provide an actuation force in the first actuation direction A1 and the second actuation direction A2.

In the embodiment of FIG. 3, the angle between the first outer surface and the second outer surface is small, for example between 1 and 10 degrees, preferably in the range between 2 and 5 degrees. The angle can be selected on the ratio of forces being required in the dominant and non-dominant direction.

A further relevant difference with respect to the embodiment of FIG. 2 is that the patterning device support 1 comprises an actuator support 9, whereby the movable parts of the four actuators 3, 4, 5, 6 are mounted on the actuator support 9. Thus, the four actuators together form an actuator unit that is mounted as a single unit on the main body of the patterning device support 1. This has the advantage that all internal forces remain within the actuator unit and are not guided through the main body of the patterning device support 1 which avoids deformations caused by these internal forces.

In the embodiment of FIG. 3, similar to the embodiment of FIG. 2, the first actuation direction A1 and the second actuation direction A2 of the actuators 3, 4, 5 and 6 are non-parallel and non-perpendicular to each other. The first actuation direction A1 is arranged with respect to the scanning direction y at an angle of +α and the second actuation direction A2 is arranged at an angle of −α, wherein α is between 0 and 45 degrees with respect to the dominant y-direction, so that the largest part of the actuation forces of the actuators 3, 4, 5, 6, can be used in this dominant y-direction, while only a small but sufficient part is available for the x-direction.

Figure 4:
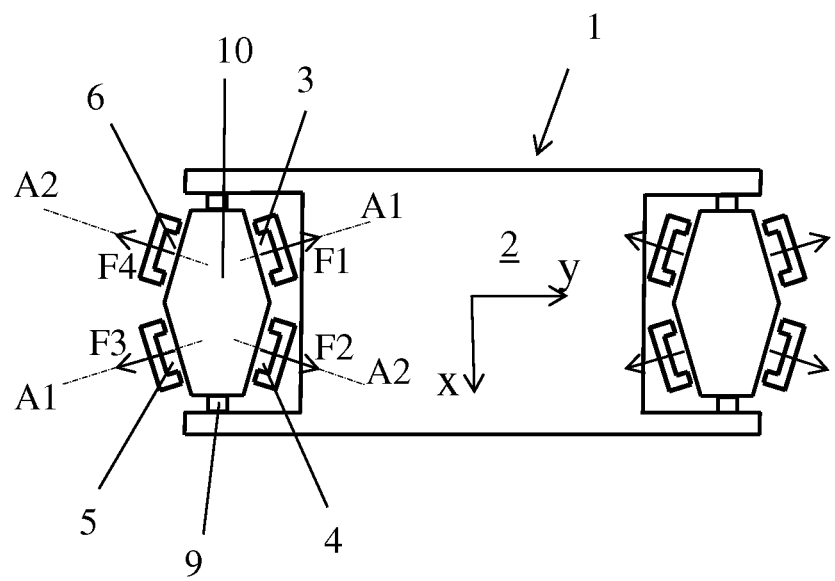
FIG. 4 depicts a top view of a third embodiment of a patterning device support.

FIG. 4 shows a further embodiment of a patterning device support 1. In this embodiment, the first actuator 3, second actuator 4, third actuator 5 and fourth actuator 6 together have a common core 10. The common core 10 has a hexagonal cross section with two outer surfaces facing the first actuator 3 and the third actuator 5 perpendicular to the first actuation direction A1 and two outer surfaces facing the second actuator 4 and the fourth actuator 6 perpendicular to the second actuation direction A2. The common core 10 is mounted on the main body with the actuator support 9.

The advantage of the embodiment of FIG. 4 is that all forces that compensate each other, i.e. the internal forces, remain within the common core 10 and are not guided through the main body of the patterning device support 1. For example, when it is desirable that the patterning device support 1 is moved in the positive y-direction, the first actuator 3 and the second actuator 4 will be simultaneously activated. As a result, the parts of the actuation forces F1 and F2 in the x-direction will be compensated by each other. In the embodiment of FIG. 2, this compensation will require that the forces will run through the main body of the patterning device support 1. In the embodiment of FIG. 4, this compensation will take place within the common core 10, and as a consequence, no internal forces will be guided through the main body.

Furthermore, the common core 10 may allow an efficient construction of the actuators 3, 4, 5, 6 of the actuator assembly.

Figure 5:
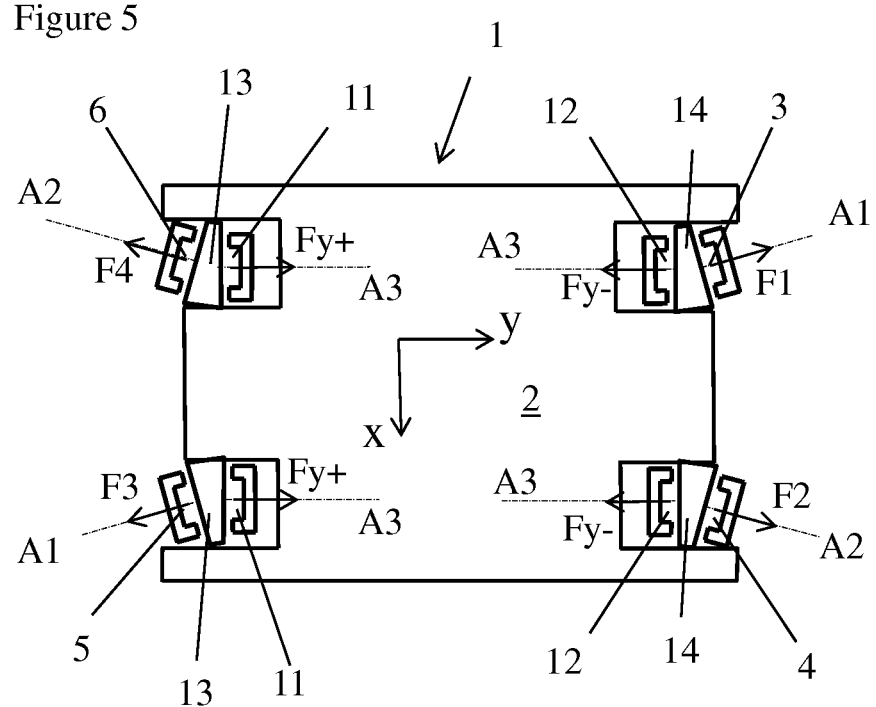
FIG. 5 depicts a top view of a fourth embodiment of a patterning device support.

FIG. 5 shows a further embodiment of a patterning device support 1 according to the invention. In the embodiment of FIG. 5, each corner of the patterning device support 1 comprises one of the first actuator 3, second actuator 4, third actuator 5 and the fourth actuator 6. The actuators 3, 4, 5, 6 are combined with y-actuators 11, 12 that are configured to exert an actuation force in a third actuation direction A3. The y-actuators 11 are configured to exert an actuation force Fy+ in the positive direction of the third actuation direction A3 and y-actuators 12 are configured to exert an actuation force Fy− in the negative direction of the third actuation direction A3.

The third actuator 5 and the fourth actuator 6 each have a common core 13 with one of the actuators 11 configured to exert an actuation force Fy+. The first actuator 3 and the second actuator 4 each have a common core 14 with one of the actuators 12 configured to exert an actuation force Fy−.

The third actuation direction A3 corresponds with the y-direction. Thus, the actuators 11, 12 are only used to exert an actuation force to move the patterning device support in the y-direction, while the actuators 3, 4, 5, 6 are used to move the patterning device support 1 both in the y-direction and the x-direction.

The advantage of this actuator assembly is that only a part of the actuators is used to provide forces in both the y-direction and the x-direction. This may be desirable when only small forces are required in the x-direction, i.e. the non-dominant direction.

Hereinabove, some examples of embodiments according to the invention have been described. It will be clear for the man skilled in the art that further configurations can be created based on the insight that the actuator assembly comprises actuators configured to exert an actuation force in a first actuation direction and a second actuation direction, wherein the first and second actuation direction are non-parallel and non-perpendicular, and in particular that the first and second actuation directions are arranged at an angle smaller than 45 degrees with respect to the dominant direction of movement of the movable support on which the actuator assembly is provided.

In an embodiment, there is provided a movable support configured to support an object, the movable support comprising: a support plane to support the object, an actuator assembly to move the movable support in a first direction and in a second direction perpendicular to the first direction, wherein the first direction and the second direction extend in a plane parallel to the support plane, the actuator assembly comprising: a first actuator configured to exert a first actuation force in a first actuation direction, the first actuation direction being parallel to the support plane, a second actuator configured to exert a second actuation force in a second actuation direction, the second actuation direction being parallel to the support plane, wherein the first actuation direction and the second actuation direction are arranged non-parallel and non-perpendicular with respect to each other.

In an embodiment, the first direction is a dominant direction of movement of the movable support, and wherein an angle between the first actuation direction and the first direction and an angle between the second actuation direction and the first direction are each smaller than 45 degrees. In an embodiment, the angle between the first actuation direction and the first direction is +α and the angle between the second actuation direction and the first direction is −α, wherein α is between 0 and 45 degrees. In an embodiment, the angle between the first actuation direction and the first direction and the angle between the second actuation direction and the first direction are each between 0 and 10 degrees. In an embodiment, the first and second actuators of the actuator assembly are reluctance type actuators comprising a core of magnetizable material and a coil. In an embodiment, the first actuator is configured to exert the first actuation force in a positive direction of the first actuation direction and wherein the second actuator is configured to exert the second actuation force in a positive direction of the second actuation direction, wherein the actuator assembly comprises: a third actuator configured to exert a third actuation force in a negative direction of the first actuation direction, and a fourth actuator configured to exert a fourth actuation force in a negative direction of the second actuation direction. In an embodiment, the first actuator and the third actuator have a first common core and/or wherein the second actuator and the fourth actuator have a second common core. In an embodiment, the first actuator and the fourth actuator have a first common core and/or wherein the second actuator and the third actuator have a second common core, wherein the first and/or second common core is wedge shaped having a first outer surface facing the coil of the first actuator and second actuator, respectively, and having a second outer surface facing the coil of the fourth actuator and the third actuator, respectively, wherein the angle between the first outer surface and the second outer surface is between 0 and 90 degrees. In an embodiment, the first actuator, the second actuator, the third actuator and the fourth actuator have a common core. In an embodiment, the common core has a hexagonal cross section. In an embodiment, the movable parts of the first actuator, the second actuator, the third actuator and the fourth actuator are arranged in a single actuator unit wherein the actuator unit is mounted on a main body of the movable support. In an embodiment, the actuator assembly comprises: a fifth actuator configured to exert a fifth actuation force in a positive direction of the first actuation direction, a sixth actuator configured to exert a sixth actuation force in a positive direction of the second actuation direction, a seventh actuator configured to exert a seventh actuation force in a negative direction of the first actuation direction, and an eighth actuator configured to exert an eighth actuation force in a negative direction of the second actuation direction. In an embodiment, the movable support is a patterning device support or substrate support. In an embodiment, the first direction is a direction of a scanning movement of the patterning device support or the substrate support.

In an embodiment, there is provided a lithographic apparatus comprising a movable support configured to support an object, the movable support comprising: a support plane to support the object, an actuator assembly to move the movable support in a first direction and in a second direction perpendicular to the first direction, wherein the first direction and the second direction extend in a plane parallel to the support plane, the actuator assembly comprising: a first actuator configured to exert a first actuation force in a first actuation direction, the first actuation direction being parallel to the support plane, a second actuator configured to exert a second actuation force in a second actuation direction, the second actuation direction being parallel to the support plane, wherein the first actuation direction and the second actuation direction are arranged non-parallel and non-perpendicular with respect to each other, and wherein the movable support is a patterning device support or a substrate support.

Hereinabove, the use of non-parallel and non-perpendicular actuation directions of actuators has been described with respect to the application in a patterning device support. In practice, such actuator assembly may be applied in any movable support in which an efficient use of actuator forces is desired, and in which there is a dominant direction of movement. The actuator assembly may in particular be used for the actuation of a substrate supports of a lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A movable support configured to support an object, the movable support comprising:
    a support plane to support the object,
    an actuator assembly to move the movable support in a first direction and in a second direction perpendicular to the first direction, wherein the first direction and the second direction extend in a plane parallel to the support plane, the actuator assembly comprising:
        a first actuator configured to exert a first actuation force in a first actuation direction, the first actuation direction being parallel to the support plane, and
        a second actuator configured to exert a second actuation force in a second actuation direction, the second actuation direction being parallel to the support plane,
        wherein the first actuation direction and the second actuation direction are arranged non-parallel and non-perpendicular with respect to each other.

2. The movable support of claim 1, wherein the first direction is a dominant direction of movement of the movable support, and wherein an angle between the first actuation direction and the first direction and an angle between the second actuation direction and the first direction are each smaller than 45 degrees.

3. The movable support of claim 2, wherein the angle between the first actuation direction and the first direction is $+\alpha$ and the angle between the second actuation direction and the first direction is $-\alpha$, wherein $\alpha$ is between 0 and 45 degrees.

4. The movable support of claim 2, wherein the angle between the first actuation direction and the first direction and the angle between the second actuation direction and the first direction are each between 0 and 10 degrees.

5. The movable support of claim 4, wherein the first and second actuators of the actuator assembly are reluctance type actuators comprising a core of magnetizable material and a coil.

6. The movable support of claim 5, wherein the first actuator is configured to exert the first actuation force in a positive direction of the first actuation direction and wherein the second actuator is configured to exert the second actuation force in a positive direction of the second actuation direction, wherein the actuator assembly comprises:
    a third actuator configured to exert a third actuation force in a negative direction of the first actuation direction, and a fourth actuator configured to exert a fourth actuation force in a negative direction of the second actuation direction.

7. The movable support of claim 6, wherein the first actuator and the third actuator have a first common core and/or wherein the second actuator and the fourth actuator have a second common core.

8. The movable support of claim 6, wherein the first actuator and the fourth actuator have a first common core and/or wherein the second actuator and the third actuator have a second common core, wherein the first and/or second common core is wedge shaped having a first outer surface facing the coil of the first actuator and second actuator, respectively, and having a second outer surface facing the coil of the fourth actuator and the third actuator, respectively, wherein the angle between the first outer surface and the second outer surface is between 0 and 90 degrees.

9. The movable support of claim 6, wherein the first actuator, the second actuator, the third actuator and the fourth actuator have a common core.

10. The movable support of claim 9, wherein the common core has a hexagonal cross section.

11. The movable support of claim 6, wherein the movable parts of the first actuator, the second actuator, the third actuator and the fourth actuator are arranged in a single actuator unit wherein the actuator unit is mounted on a main body of the movable support.

12. The movable support of claim 6, wherein the actuator assembly comprises:
a fifth actuator configured to exert a fifth actuation force in a positive direction of the first actuation direction,
a sixth actuator configured to exert a sixth actuation force in a positive direction of the second actuation direction,
a seventh actuator configured to exert a seventh actuation force in a negative direction of the first actuation direction, and
an eighth actuator configured to exert an eighth actuation force in a negative direction of the second actuation direction.

13. The movable support of claim 1, wherein the movable support is a patterning device support or substrate support.

14. The movable support of claim 13, wherein the first direction is a direction of a scanning movement of the patterning device support or the substrate support.

15. A lithographic apparatus comprising a movable support configured to support an object, the movable support comprising:
a support plane to support the object,
an actuator assembly to move the movable support in a first direction and in a second direction perpendicular to the first direction, wherein the first direction and the second direction extend in a plane parallel to the support plane, the actuator assembly comprising:
a first actuator configured to exert a first actuation force in a first actuation direction, the first actuation direction being parallel to the support plane,
a second actuator configured to exert a second actuation force in a second actuation direction, the second actuation direction being parallel to the support plane,
wherein the first actuation direction and the second actuation direction are arranged non-parallel and non-perpendicular with respect to each other, and
wherein the movable support is a patterning device support or a substrate support.

16. The lithographic apparatus of claim 15, wherein the first direction is a dominant direction of movement of the movable support, and wherein an angle between the first actuation direction and the first direction and an angle between the second actuation direction and the first direction are each smaller than 45 degrees.

17. The lithographic apparatus of claim 15, wherein the angle between the first actuation direction and the first direction is $+\alpha$ and the angle between the second actuation direction and the first direction is $-\alpha$, wherein $\alpha$ is between 0 and 45 degrees.

18. A method comprising:
moving, using an actuator assembly, a movable support supporting an object in a first direction and in a second direction perpendicular to the first direction, wherein the first direction and the second direction extend in a plane parallel to a support plane of the movable support to support the object, wherein the actuator assembly comprises:
a first actuator configured to exert a first actuation force in a first actuation direction, the first actuation direction being parallel to the support plane, and
a second actuator configured to exert a second actuation force in a second actuation direction, the second actuation direction being parallel to the support plane,
wherein the first actuation direction and the second actuation direction are arranged non-parallel and non-perpendicular with respect to each other.

19. The method of claim 18, wherein the first direction is a dominant direction of movement of the movable support, and wherein an angle between the first actuation direction and the first direction and an angle between the second actuation direction and the first direction are each smaller than 45 degrees.

20. The method of claim 18, wherein the angle between the first actuation direction and the first direction is $+\alpha$ and the angle between the second actuation direction and the first direction is $-\alpha$, wherein $\alpha$ is between 0 and 45 degrees.

* * * * *